(12) United States Patent  
Wang

(10) Patent No.: US 8,824,149 B2
(45) Date of Patent: Sep. 2, 2014

(54) POWER SUPPLY UNIT WITH LATCH

(75) Inventor: Huan-Chin Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 308 days.

(21) Appl. No.: 13/306,988

(22) Filed: Nov. 30, 2011

(65) Prior Publication Data

US 2013/0094156 A1 Apr. 18, 2013

(30) Foreign Application Priority Data

Oct. 18, 2011 (TW) ................ 100137749 A

(51) Int. Cl.
*H05K 7/00* (2006.01)
*G06F 1/18* (2006.01)
*H05K 5/02* (2006.01)

(52) U.S. Cl.
CPC ............... *G06F 1/188* (2013.01); *G06F 1/181* (2013.01); *H05K 5/0221* (2013.01); *H05K 7/00* (2013.01)
USPC ............................. 361/747; 361/272; 361/807

(58) Field of Classification Search
CPC ........... G06F 1/181; G06F 1/188; H05K 7/00; H05K 5/0217; H05K 7/1432; H05K 5/0221
USPC ................................ 335/679.01–679.45, 747; 361/679.01–679.45, 747, 727, 807
See application file for complete search history.

(56) References Cited

U.S. PATENT DOCUMENTS

| 6,801,435 | B1 * | 10/2004 | Su et al. ........................ 361/747 |
| 2006/0250777 | A1 * | 11/2006 | Chen et al. .................... 361/727 |
| 2008/0266817 | A1 * | 10/2008 | Li ................................. 361/747 |
| 2009/0147459 | A1 * | 6/2009 | Nguyen et al. ............ 361/679.31 |
| 2010/0309611 | A1 * | 12/2010 | Fan et al. ................. 361/679.01 |
| 2012/0293975 | A1 * | 11/2012 | Liang ............................ 361/807 |

* cited by examiner

*Primary Examiner* — Bernard Rojas
(74) *Attorney, Agent, or Firm* — Novak Druce Connolly Bove + Quigg LLP

(57) ABSTRACT

A power supply unit includes a sidewall, an end wall, a resilient latch, and a block. The end wall is connected to the sidewall. A stop plate extends outward from the end wall adjacent to the sidewall. A first end of the latch is connected to an inner surface of the sidewall. A latching portion protrudes outward from the latch, to be extended out of the sidewall. The block is pivotably connected to a second end of the latch opposite to the first end. The block is extended out of the end wall between the stop plate and the sidewall. When the block is rotated, a first side of the block is capable of engaging with the stop plate, to prevent the latch from moving away from the sidewall such that the latching portion cannot withdraw from the through slot.

12 Claims, 3 Drawing Sheets

POWER SUPPLY UNIT WITH LATCH

BACKGROUND

1. Technical Field

The present disclosure relates to a power supply unit with a latch for latching the power supply unit to a device.

2. Description of Related Art

A resilient latch is generally mounted to a sidewall of a power supply unit. When the power supply unit is mounted in a bracket of an electronic device, the latch engages with the bracket, to fix the power supply unit to the bracket. However, the latch is apt to disengage from the bracket if the electronic device vibrates or shakes too much, which may cause the power supply unit to drop from the bracket and cause damage or be damaged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 2:
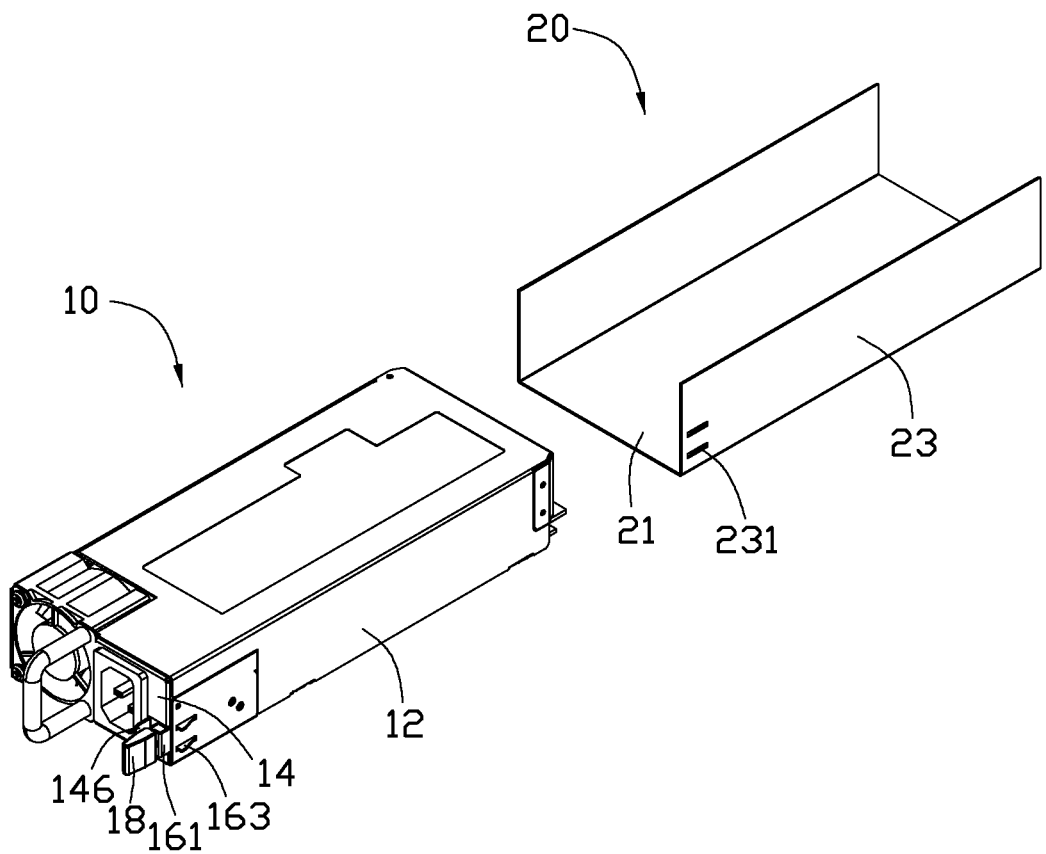
FIG. 2 is an exploded, isometric view of FIG. 1.
Figure 3:
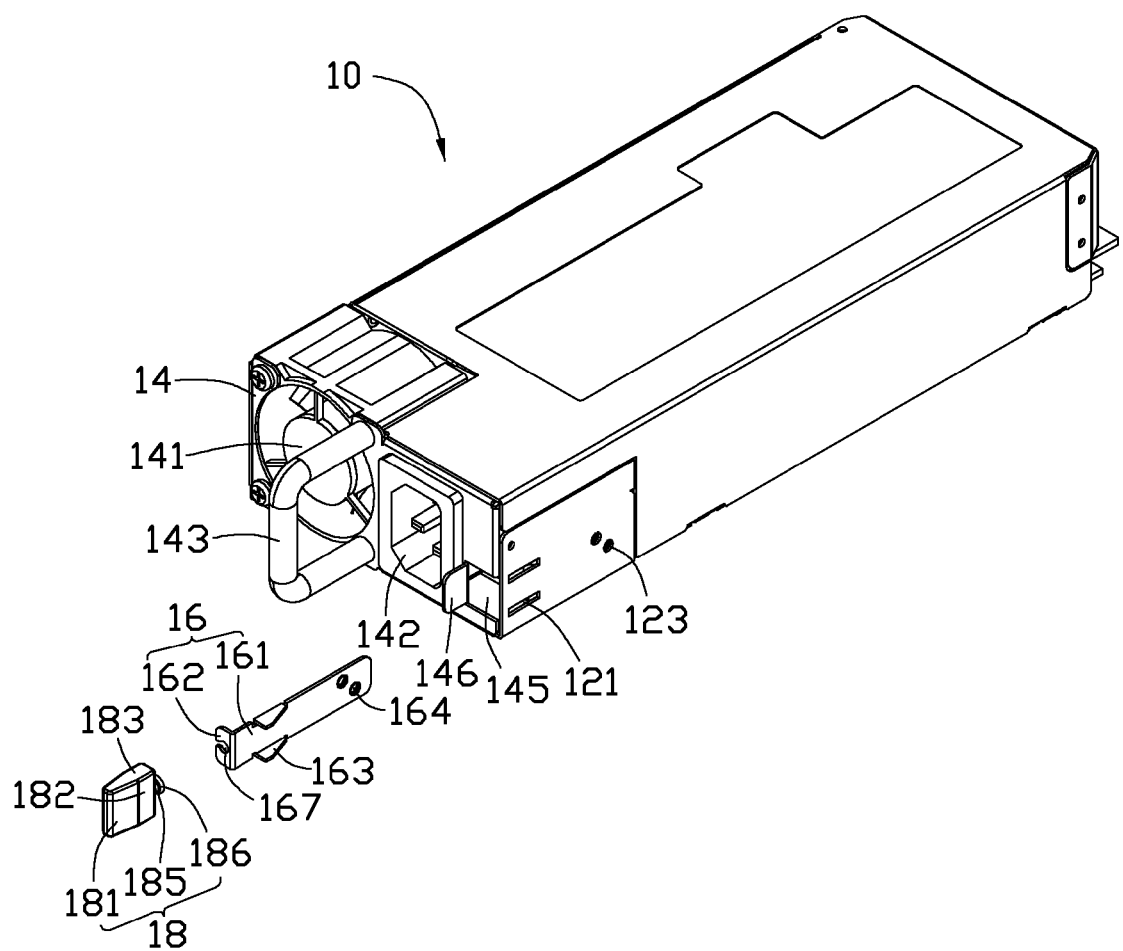
FIG. 3 is an exploded, isometric view of the power supply unit of FIG. 2.

Referring to FIGS. 2 and 3, an exemplary embodiment of a power supply unit 10 is provided to be firmly fixed to a bracket 20.

The power supply unit 10 includes a sidewall 12, an end wall 14 perpendicularly connected to the sidewall 12, a resilient latch 16, and a block 18.

Two through slots 121 are defined in the sidewall 12 adjacent to the end wall 14. Two fixing holes 123 are defined in the sidewall 12 at a side of the through slots 121 away from the end wall 14.

A fan 141 and a power socket 142 are mounted in the power supply unit 10 and exposed through the end wall 14. A handle 143 is formed on the outer side of the end wall 14. A stop plate 146 parallel to the sidewall 12 perpendicularly extends outward from the end wall 14 adjacent to the sidewall 12. An opening 145 is defined in the end wall 14 between the stop plate 146 and the sidewall 12.

The latch 16 includes an elongated resilient plate 161, and a fixing plate 162 perpendicularly extending in a first direction from an end of the resilient plate 161. Two latching portions 163 perpendicularly extend in a second direction opposite to the first direction from opposite sides of the resilient plate 161 adjacent to the fixing plate 162. Two through holes 164 are defined in the resilient plate 161 away from the fixing plate 162. A substantially C-shaped pivot hole 167 is defined in the fixing plate 162, with an opening of the pivot hole 167 extending through an end of the fixing plate 162 away from the resilient plate 161.

The block 18 is made of plastic material, and includes a main body 181. The main body 181 includes two opposite first sides 183 and two opposite second sides 182. Each second side 182 is wider than each first side 183. A pole 185 protrudes from the middle of an end of the main body 181, and a head 186 is formed on a distal end of the pole 186 away from the main body 181. A diameter of the head 186 is greater than a diameter of the pole 185.

The bracket 20 includes a bottom plate 21, and two side plates 23 respectively extending up from opposite sides of the bottom plate 21. Two latching slots 231 are defined in one of the side plates 23 adjacent to an end.

Figure 1:
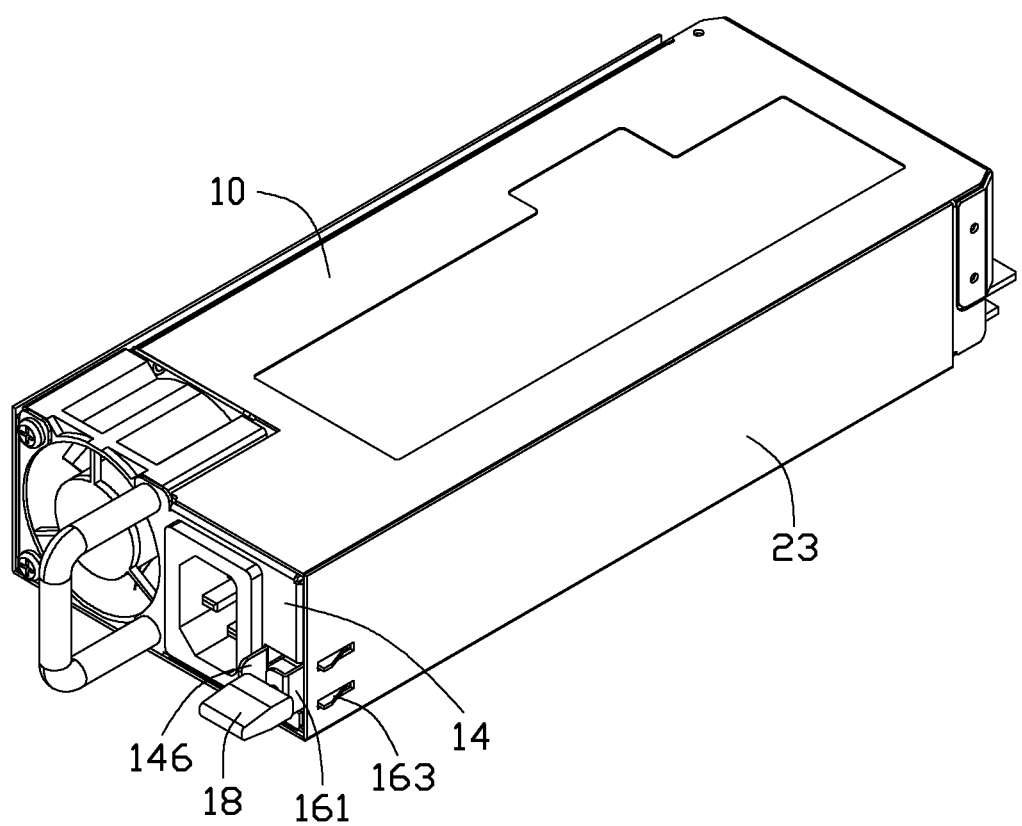
FIG. 1 is an assembled, isometric view of an exemplary embodiment of a power supply unit together with a bracket.

Referring to FIG. 1, to assemble the power supply unit 10, the resilient plate 161 is extended through the opening 145 and clings to the inner surface of the sidewall 12, with the latching portions 163 extending out of the sidewall 12 through the through slots 121, and the through holes 164 aligning with the fixing holes 123. Two fasteners, such as screws or rivets, are respectively extended through the through holes 164 and engaged in the fixing holes 123, to fix the end of the resilient plate 161 away from the fixing plate 162 to the inner surface of the sidewall 12. The fixing plate 162 is located outside the end wall 14 through the opening 145 and extends toward the stop plate 146. The pole 185 is pivotably engaged in the pivot hole 167, with the head 186 engaging with the inner surface of the fixing plate 162, and the main body 181 engaging with the outer surface of the fixing plate 162. Thereby, the block 18 is pivotably connected to the fixing plate 162. The power supply unit 10 is assembled.

In the embodiment, a perpendicular distance between each first side 183 and the axis of the pole 185 is slightly greater than a perpendicular distance between the stop plate 146 and the axis of the pivot hole 167. When the block 18 is rotated to make the main body 181 perpendicular to the stop plate 146, one of the first sides 183 abuts against the stop plate 146, and is fixed to the stop plate 14 by friction between the stop plate 14 and the first side 183. In other embodiments, a perpendicular distance between each first side 183 and the axis of the pole 185 is substantially equal to a perpendicular distance between the stop plate 146 and the axis of the pivot hole 167. Because the block 18 is made of plastic material, the block 18 is capable of being rotated and fixed to any position by friction between the block 18 and the fixing plate 162. When the block 18 is positioned to allow either of the first sides 183 to abut against the stop plate 146, the stop plate 146 can prevent the block 18 and the latch 16 from moving towards the stop plate 146.

To assemble the power supply unit 10 to the bracket 20, the block 18 is rotated to allow the main body 181 to be substantially parallel to the stop plate 146. The power supply unit 10 is inserted into the bracket 20, with the latching portions 163 abutting against a corresponding one of the side plates 23 that defines the latching slots 231. The latch 16 is deformed inwards away from the corresponding side plate 23. When the power supply unit 10 is completely received in the bracket 20, the latching portions 163 respectively align with the latching slots 231. The latch 16 is restored, to allow the latching portions 163 to respectively engage in the latching slots 231. Thereby, the power supply unit 10 is fixed to the bracket 20. The block 18 is rotated, to allow one of the first sides 183 to abut against the stop plate 146. Thereby, the power supply unit 10 is locked to the bracket 20. The latch 16 cannot escape the latching slots 231 because of vibration.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A power supply unit, comprising:
a sidewall defining a through slot;
an end wall connected to an end of the sidewall, a stop plate extending outward from the end wall adjacent to the sidewall, and an opening defined in the end wall between the stop plate and the sidewall;
a resilient latch connected to an inner surface of the sidewall at a first end of the latch, a latching portion protruding outward from the latch away from the first end, wherein the latching portion extends out of the sidewall through the through slot; and
a block pivotably connected to a second end of the latch opposite to the first end, wherein the block is extended out of the end wall through the opening and comprises a first side, when the block is rotated, the first side of the block is capable of engaging with the stop plate, to prevent the latch from moving away from the sidewall such that the latching portion cannot withdraw from the through slot, and wherein the latch comprises an elongated resilient plate and a fixing plate, a first end of the resilient plate is the first end of the latch, the fixing plate, being the second end of the latch, extends toward the stop plate from a second end of the resilient plate opposite to the first end of the resilient plate, the block is pivotably connected to the fixing plate.

2. The power supply unit of claim 1, wherein a substantially C-shaped pivot hole is defined in the fixing plate, with an opening of the pivot hole extending through an end of the fixing plate away from the resilient plate, the block comprises a main body, a pole protruding from a middle of an end of the main body, and a head formed on a distal end of the pole away from the main body, the first side is formed on the main body, the pole is pivotably engaged in the pivot hole, the main body and the head respectively engage with outer and inner sides of the fixing plate.

3. The power supply unit of claim 2, wherein a perpendicular distance between the first side and an axis of the pole is equal to a perpendicular distance between the stop plate and an axis of the pivot hole.

4. The power supply unit of claim 3, wherein the block is made of plastic, when the block is rotated, the block is capable of being fixed to any position by friction between the block and the fixing plate.

5. The power supply unit of claim 2, wherein a perpendicular distance between the first side and an axis of the pole is slightly greater than a perpendicular distance between the stop plate and an axis of the pivot hole, when the block is rotated to allow the first side to abut against the stop plate, the block is capable of being fixed to the stop plate by a friction between the stop plate and the first side.

6. The power supply unit of claim 2, wherein a perpendicular distance between the first side and an axis of the pole is slightly greater than a perpendicular distance between the stop plate and an axis of the pivot hole, when the block is rotated to allow the first side to abut against the stop plate, the block is capable of being fixed to the stop plate by a friction between the stop plate and the first side.

7. A power supply unit assembly, comprising:
a bracket comprising a bottom plate, and two side plates respectively extending up from opposite sides of the bottom plate, a latching slot defined in one of the side plates adjacent to an end; and
a power supply unit received in the bracket, and comprising a sidewall defining a through slot aligning with the latching slot, an end wall perpendicularly connected to an end of the sidewall adjacent to the through slot, a resilient latch connected to an inner surface of the sidewall at a first end of the latch, and a block pivotably connected to a second end of the latch opposite to the first end, wherein a stop plate extends outward from the end wall adjacent to the sidewall, the block is extended out of the end wall between the stop plate and the sidewall, a latching portion protrudes outward from the latch to extend through the through slot of the sidewall and engage in the latching slot of the bracket, the block comprises a first side, when the block is rotated, the first side of the block is capable of engaging with the stop plate, to prevent the latch from moving away from the sidewall such that the latching portion cannot withdraw from the latching slot, and wherein the latch comprises an elongated resilient plate and a fixing plate, a first end of the resilient plate is the first end of the latch, the fixing plate, being the second end of the latch, extends toward the stop plate from a second end of the resilient plate opposite to the first end of the resilient plate, the block is pivotably connected to the fixing plate.

8. The power supply unit assembly of claim 7, wherein a substantially C-shaped pivot hole is defined in the fixing plate, with an opening of the pivot hole extending through an end of the fixing plate away from the resilient plate, the block comprises a main body, a pole protruding from a middle of an end of the main body, and a head formed on a distal end of the pole away from the main body, the first side is formed on the main body, the pole is pivotably engaged in the pivot hole, the main body and the head respectively engage with outer and inner sides of the fixing plate.

9. The power supply unit assembly of claim 8, wherein a perpendicular distance between the first side and an axis of the pole is equal to a perpendicular distance between the stop plate and an axis of the pivot hole.

10. The power supply unit assembly of claim 9, wherein the block is made of plastic, when the block is rotated, the block is capable of being fixed to any position by friction between the block and the fixing plate.

11. The power supply unit assembly of claim 8, wherein a perpendicular distance between the first side and an axis of the pole is slightly greater than a perpendicular distance between the stop plate and an axis of the pivot hole, when the block is rotated to allow the first side to abut against the stop plate, the block is capable of being fixed to the stop plate by a friction between the stop plate and the first side.

12. The power supply unit assembly of claim 8, wherein the main body further comprises two opposite second sides and a third side opposite to the first side, each of the first and third sides is narrower than each second side.

* * * * *